(12) United States Patent
Qu

(10) Patent No.: US 8,479,806 B2
(45) Date of Patent: Jul. 9, 2013

(54) TWO-PHASE CROSS-CONNECTED MICRO-CHANNEL HEAT SINK

(75) Inventor: Weilin Qu, Honolulu, HI (US)

(73) Assignee: University of Hawaii, Honolulu, HI (US)

( * ) Notice: Subject to any disclaimer, the term of this patent is extended or adjusted under 35 U.S.C. 154(b) by 813 days.

(21) Appl. No.: 12/034,271

(22) Filed: Feb. 20, 2008

(65) Prior Publication Data

US 2009/0139701 A1 Jun. 4, 2009

Related U.S. Application Data

(60) Provisional application No. 61/004,821, filed on Nov. 30, 2007.

(51) Int. Cl.
*F28F 7/00* (2006.01)
*H05K 7/20* (2006.01)

(52) U.S. Cl.
USPC .......................................... 165/80.5; 165/80.4

(58) Field of Classification Search
USPC ............ 165/80.3, 80.4, 185, 104.19, 104.21, 165/80.5; 361/697, 698, 699, 700, 702, 703; 257/714, 715
See application file for complete search history.

(56) References Cited

U.S. PATENT DOCUMENTS

| 4,282,927 A | | 8/1981 | Simmons | |
|---|---|---|---|---|
| 4,624,305 A | | 11/1986 | Rojey | |
| 4,765,397 A | | 8/1988 | Chrysler et al. | |
| 4,894,709 A | * | 1/1990 | Phillips et al. | 257/714 |
| 4,909,315 A | | 3/1990 | Nelson et al. | |
| 4,940,085 A | | 7/1990 | Nelson et al. | |
| 5,002,123 A | | 3/1991 | Nelson et al. | |
| 5,099,311 A | | 3/1992 | Bonde et al. | |
| 5,174,370 A | | 12/1992 | Hallgren | |
| 5,720,341 A | | 2/1998 | Watanabe et al. | |
| 5,794,607 A | * | 8/1998 | Aihara et al. | 125/16.02 |
| 5,835,345 A | * | 11/1998 | Staskus et al. | 361/699 |
| 6,101,715 A | * | 8/2000 | Fuesser et al. | 29/890.03 |
| 6,247,529 B1 | | 6/2001 | Shimizu et al. | |

(Continued)

FOREIGN PATENT DOCUMENTS

WO WO2007006590 1/2007

OTHER PUBLICATIONS

Kenneth E. Goodson, Improved Heat Sink for Laser Diode Array Using Microchannels in CVD Diamond, Feb. 1997, Part B, vol. 20, No. 1.*

(Continued)

*Primary Examiner* — Tho V Duong
(74) *Attorney, Agent, or Firm* — Ganz Law, P.C.

(57) ABSTRACT

An improved two-phase micro-channel heat sink has a plurality of flow micro-channels extending in parallel in a longitudinal direction for accommodating a flow of liquid coolant therein, and a plurality of cross-connected micro-channels extending in parallel in a transverse direction formed at regular intervals along the longitudinal direction for cross-connecting with the flow micro-channels. The cross-connected micro-channels enable a uniform pressure field to be maintained for two-phase flow boiling of liquid coolant in the heat sink. In a preferred embodiment, the heat sink contains flow micro-channels with width of 100 μm, wall thickness of 100 μm, and height of 600 μm, and cross-connected micro-channels of similar width and height cut at 1 mm intervals along the flow direction.

4 Claims, 4 Drawing Sheets

Overall cross-connected micro-channel heat sink layout

U.S. PATENT DOCUMENTS

| | | | |
|---|---|---|---|
| 6,301,109 | B1 | 10/2001 | Chu et al. |
| 6,333,852 | B1 | 12/2001 | Lin |
| 6,343,016 | B1 | 1/2002 | Lin |
| 6,422,307 | B1 | 7/2002 | Bhatti et al. |
| 6,424,531 | B1 | 7/2002 | Bhatti et al. |
| 6,615,911 | B1 | 9/2003 | Bhatti et al. |
| 6,741,469 | B1 | 5/2004 | Monfarad |
| 6,761,211 | B2 | 7/2004 | Bhatti et al. |
| 6,903,929 | B2 | 6/2005 | Phrasher et al. |
| 6,904,966 | B2 | 6/2005 | Philpott et al. |
| 6,934,154 | B2 | 8/2005 | Prasher et al. |
| 6,988,534 | B2 | 1/2006 | Kenny et al. |
| 6,988,535 | B2 | 1/2006 | Upadhya et al. |
| 6,994,151 | B2 * | 2/2006 | Zhou et al. ............... 165/80.4 |
| 7,104,312 | B2 | 9/2006 | Goodson et al. |
| 7,139,172 | B2 | 11/2006 | Bezama et al. |
| 7,228,894 | B2 | 6/2007 | Moore et al. |
| 7,234,514 | B2 | 6/2007 | Vogel |
| 7,277,284 | B2 | 10/2007 | Lee et al. |
| 7,304,842 | B2 | 12/2007 | Yatskov |
| 7,325,410 | B1 | 2/2008 | Bean, Jr. |
| 7,353,859 | B2 | 4/2008 | Stevanovic et al. |
| 7,411,290 | B2 | 8/2008 | Lee et al. |
| 7,672,129 | B1 * | 3/2010 | Ouyang et al. ............. 361/699 |
| 7,690,419 | B2 | 4/2010 | Thayer et al. |
| 8,167,030 | B2 | 5/2012 | Kolb et al. |
| 2002/0056544 | A1 | 5/2002 | Azar |
| 2002/0174979 | A1 | 11/2002 | Haegele et al. |
| 2003/0136545 | A1 | 7/2003 | Lin et al. |
| 2003/0141040 | A1 | 7/2003 | Lee et al. |
| 2004/0112571 | A1 * | 6/2004 | Kenny et al. ............... 165/80.3 |
| 2004/0112585 | A1 * | 6/2004 | Goodson et al. ............. 165/299 |
| 2004/0190252 | A1 * | 9/2004 | Prasher et al. ............. 361/699 |
| 2004/0250994 | A1 | 12/2004 | Chordia |
| 2005/0126760 | A1 | 6/2005 | Makino et al. |
| 2005/0173098 | A1 | 8/2005 | Connors |
| 2005/0200001 | A1 | 9/2005 | Joshi et al. |
| 2006/0002088 | A1 | 1/2006 | Bezama et al. |
| 2006/0011325 | A1 * | 1/2006 | Schlitz ...................... 165/80.3 |
| 2006/0021744 | A1 | 2/2006 | Vogel |
| 2006/0142401 | A1 | 6/2006 | Tonkovich et al. |
| 2006/0185823 | A1 | 8/2006 | Thayer et al. |
| 2006/0191674 | A1 | 8/2006 | Persson |
| 2006/0237166 | A1 | 10/2006 | Otey et al. |
| 2006/0278373 | A1 | 12/2006 | Hsu |
| 2006/0279936 | A1 | 12/2006 | Karidis et al. |
| 2007/0012423 | A1 | 1/2007 | Kinoshita et al. |
| 2008/0179044 | A1 | 7/2008 | Hu et al. |
| 2012/0097382 | A1 | 4/2012 | Chen et al. |

OTHER PUBLICATIONS

PCT International Search Report and Written Opinion of the International Searching Authority, issued Jan. 29, 2009, application No. PCT/US2008/084440.

Weilin Qu and Issam Mudawar, "Transport Phenomena in Two-Phase Micro-Channel Heat Sinks", Proceedings of IMECE2002, ASME International Mechanical Engineering Congress & Exposition, Nov. 2002, pp. 1-13.

Weilin Qu and Issam Mudawar, "Analysis of three-dimensional heat transfer in micro-channel heat sinks", International Journal of Heat and Mass Transfer 45, 2002, pp. 3973-3985.

Weilin Qu and Issam Mudawar, "Prediction and measurement of incipient boiling heat flux in micro-channel heat sinks", International Journal of Heat and Mass Transfer 45, 2002, pp. 3933-3945.

Weilin Qu and Issam Mudawar, "Thermal Design Methodology for High-Heat-Flux Single-Phase and Two-Phase Micro-Channel Heat Sinks", IEEE Transactions on Components and Packaging Technologies, vol. 26, No. 3, Sep. 2003, pp. 598-609.

Weilin Qu and Issam Mudawar, "Transport Phenomena in Two-Phase Micro-Channel Heat Sinks", Journal of Electronic Packaging, vol. 126, Jun. 2004, pp. 213-224.

Weilin Qu, et al., "Two-Phase Flow and Heat Transfer in Rectangular Micro-Channels", Transactions of the ASME, vol. 126, Sep. 2004, pp. 288-300.

Sang-Youp Lee, et al., "Microchannel Flow Measurement Using Micro Particle Image Velocimetry", Proceedings of IMECE2002, ASME International Mechanical Engineering Congress & Exposition, Nov. 2002, pp. 1-8.

D.B. Tuckerman and R.F.W. Pease, "High Performance Heat Sinking for VLSI", IEEE, 1981, pp. 126-129.

Muhammad M. Rahman and Fulin Gui, "Experimental Measurements of Fluid Flow and Heat Transfer in Microchannel Cooling Passages in a Chip Substrate", Advances in Electronic Packaging, ASME, EEP-vol. 4-2, 1993, pp. 685-692.

Tohru Kishimoto and Takaaki Ohsaki, "VLSI Packaging Technique Using Liquid-Cooled Channels", IEEE Transactions on Components, Hybrids, and Manufacturing Technology, vol. CHMT-9, No. 4, Dec. 1986, pp. 328-335.

Koichiro Kawano, et al., "Micro Channel Heat Exchanger for Cooling Electrical Equipment", HTD-vol. 361-3/PID-vol. 3, Proceedings of the ASME, Heat Transfer Division—vol. 3, ASME 1998, pp. 173-180.

Todd M. Harms, et al., "Developing convection heat transfer in deep rectangular microchannels", International Journal of Heat and Fluid Flow 20, 1999, pp. 149-157.

Weilin Qu and Issam Mudawar, "Experimental and numerical study of pressure drop and heat transfer in a single-phase micro-channel heat sink", International Journal of Heat and Mass Transfer 45, 2002, pp. 2549-2565.

Poh-Seng Lee, et al., "Investigation of heat transfer in rectangular microchannels", International Journal of Heat and Mass Trasnfer 48, 2005, pp. 1688-1704.

M. B. Bowers and I. Mudawar, "High flux boiling in low flow rate, low pressure drop mini-channel and micro-channel heat sinks", Int. J. Heat Mass Transfer, vol. 37, No. 2, 1994, pp. 321-332.

T. S. Ravigururajan, "Impact of Channel Geometry on Two-Phase Flow Heat Transfer Characteristics of Refrigerants in Microchannel Heat Exchangers", Journal of Heat Transfer, vol. 120, May 1998, pp. 485-491.

G. M. Roach, Jr., et al., "Low-Flow Critical Heat Flux in Heated Microchannels", Nuclear Science and Engineering: 131, 1999, pp. 411-425.

Lian Zhang, et al., "Measurements and Modeling of Two-Phase Flow in Microchannels with Nearly-Constant Heat Flux Boundary Conditions", Micro-Electro-Mechanical Systems (MEMS), vol. 2., ASME 2000, pp. 129-135.

Linan Jiang, et al., "Forced Convection Boiling in a Microchannel Heat Sink", Journal of Microelectromechanical Systems, vol. 16, No. 1, Mar. 2001, pp. 80-87.

Gopinath R. Warder, et al., "Heat transfer and pressure drop in narrow rectangular channels", Experimental Thermal and Fluid Science 26, 2002, pp. 53-64.

G. Hetsroni, et al., "A uniform temperature heat sink for cooling of electronic devices", International Journal of Heat and Mass Transfer 45, 2002, pp. 3275-3286.

Weilin Qu and Issam Mudawar, "Measurement and prediction of pressure drop in two-phase micro-channel heat sinks", International Journal of Heat and Mass Transfer 46, 2003, pp. 2737-2753.

Weilin Qu and Issam Mudawar, "Flow boiling heat transfer in two-phase micro-channel heat sinks—I. Experimental investigation and assessment of correlation methods", International Journal of Heat and Mass Transfer 46, 2003, pp. 2755-2771.

Weilin Qu and Issam Mudawar, "Flow boiling heat transfer in two-phase micro-channel heat sinks—II. Annular two-phase flow model", International Journal of Heat and Mass Transfer 46, 2003, pp. 2773-2784.

Weilin Qu and Issam Mudawar, "Measurement and correlation of critical heat flux in two-phase micro-channel heat sinks", International Journal of Heat and Mass Transfer 47, 2004, pp. 2045-2059.

Mark E. Steinke and Satish G. Kandlikar, "An Experimental Investigation of Flow Boiling Characteristics of Water in Parallel Microchannels", Transactions of the ASME, vol. 126, Aug. 2004, pp. 518-526.

Jaeseon Lee and Issam Mudawar, "Two-phase flow in high-heat-flux micro-channel heat sink for refrigeration cooling applications: Part I—pressure drop characteristics", International Journal of Heat and Mass Transfer 48, 2005, pp. 928-940.

Jaeseon Lee and Issam Mudawar, "Two-phase flow in high-heat-flux micro-channel heat sink for refrigeration cooling applications: Part II—heat transfer characteristics", International Journal of Heat and Mass Transfer 48, 2005, pp. 941-955.

R. W. Knight, et al., "Optimal Thermal Design of Forced Convection Heat Sinks—Analytical", Journal of Electronic Packaging, vol. 113, Sep. 1991, pp. 313-321.

Roy W. Knight, et al., "Heat Sink Optimization with Application to Microchannels", IEEE Transactions on Components, Hybrids, and Manufacturing Technology, vol. 15, No. 5, Oct. 1992, pp. 832-842.

S. F. Choquette, et al., "Optimum Design of Microchannel Heat Sinks", Microelectromechanical Systems (MEMS), DSC-vol. 59, ASME 1996, pp. 115-126.

D.Y. Lee and K. Vafai, "Comparative analysis of jet impingement and microchannel cooling for high heat flux applications", International Journal of Heat and Mass Transfer 42, 1999, pp. 1555-1568.

Weilin Qu and Issam Mudawar, "A Systematic Methodology for Optimal Design of Two-Phase Micro-Channel Heat Sinks", Journal of Electronic Packaging, vol. 127, Dec. 2005, pp. 381-390.

S.M. Zivi, "Estimation of Steady-State Steam Void-Fraction by Means of the Principle of Minimum Entropy Production", Journal of Heat Transfer, Transactions of the ASME, May 1964, pp. 247-252.

Weilin Qu, et al., "Two-Phase Flow and Heat Transfer in Rectangular Micro-Channels", Proceedings of 2003 ASME Summer Heat Transfer Conference, Jul. 2003, pp. 1-14.

PCT International Search Report and Written Opinion of the International Searching Authority, issued Feb. 2, 2009, application No. PCT/US2008/084419.

PCT International Search Report and Written Opinion of the International Searching Authority, issued May 3, 2010, application No. PCT/US10/025797.

PCT International Search Report and Written Opinion of the International Searching Authority, issued Sep. 22, 2009, application No. PCT/US09/052317.

PCT International Search Report and Written Opinion of the International Searching Authority, issued Feb. 2, 2009, application No. PCT/US08/084419.

Taiwanese Application No. 97145622 Examination Report dated Oct. 25, 2011.

U.S. Appl. No. 12/275,873 Final Office Action dated Nov. 18, 2011.

U.S. Appl. No. 12/275,873 Non-final Office Action dated Mar. 26, 2013.

U.S. Appl. No. 12/275,873 Non-final Office Action dated Jun. 23, 2011.

U.S. Appl. No. 12/275,873 Non-final Office Action dated Aug. 31, 2012.

* cited by examiner

Section of cross-connected micro-channel heat sink design

Overall cross-connected micro-channel heat sink layout

Conventional micro-channel heat sink design

Conventional two-phase micro-channel heat sink

Improved cross-connected two-phase micro-channel heat sink

TWO-PHASE CROSS-CONNECTED MICRO-CHANNEL HEAT SINK

This U.S. patent application claims the priority of Provisional Patent Application 61/004,821 filed on Nov. 30, 2007, by the same inventor.

TECHNICAL FIELD

The present invention is directed to a heat sink device for efficient cooling of high-power-density electronic devices and, more particularly, to an improved design for a two-phase micro-channel heat sink.

BACKGROUND OF INVENTION

The ceaseless pursuit of improvement in performance of electronic devices with simultaneous reductions in weight and volume has sought improvements in efficient heat sink designs for ever-increasing dissipative waste heat densities. Current and near future high-performance commercial/defense electronic devices require heat fluxes on the order of 100 W/cm2 to be dissipated. As the reliability and life span of electronics are both strongly affected by temperature, it is necessary to develop highly efficient cooling techniques to reduce the maintenance costs and increase the service life of high-power-density electronic devices.

Two-phase micro-channel heat sinks are an attractive solution for removing waste heat from high-power-density devices, as described for example in "Thermal Design Methodology for Low Flow Rate Single-Phase and Two-Phase Micro-Channel Heat Sinks," by Scott Lee and Weilin Qu, published in IEEE Transactions on Components and Packaging Technologies, December 2007. Two-phase micro-channel heat sinks feature micro-size parallel channels as coolant flow passages for flow boiling of liquid coolant. Key merits include low thermal resistance to heat dissipation, large surface-area-to-volume ratio, small heat sink weight and volume, small liquid coolant inventory and flow rate requirement, and relatively uniform temperature distribution along the stream-wise direction. However, one practical concern that hinders the implementation of this powerful cooling scheme is the temperature and pressure oscillation due to flow instability. It would be desirable to provide an improved design which can prevent severe flow instability and therefore ensure safe operation and predictable cooling performance.

SUMMARY OF INVENTION

In accordance with the present invention, an improved two-phase micro-channel heat sink comprises: a plurality of flow micro-channels extending in parallel in a longitudinal direction and having channel walls substantially symmetrical with each other of a given wall thickness and defining a flow channel width and height for accommodating a flow of liquid coolant therein; and a plurality of cross-connected micro-channels extending in parallel in a transverse direction normal to the longitudinal direction and being substantially symmetrical with each other and formed at regular intervals along the longitudinal direction for cross-connecting with the flow micro-channels, thereby enabling a uniform pressure field to be maintained for two-phase flow boiling of liquid coolant in the heat sink.

In a preferred embodiment, the heat sink contains flow micro-channels with width of 100 µm, wall thickness of 100 µm, and height of 600 µm, and cross-connected micro-channels of similar width and height cut at 1 mm intervals along the flow direction.

The cross-connection design prevents the severe flow oscillation that can occur in parallel channel designs due to feedback interaction between flow channels through common inlet and outlet plenums, by promoting the communication of flow between channels and creating a uniform pressure field in the heat sink. The novel two-phase cross-connected micro-channel heat sink can therefore deliver more stable flow and ensure safe operation and predictable cooling performance.

The two-phase cross-connected micro-channel heat sinks are capable of dissipating high heat fluxes from small areas, and hence, are suitable for thermal management of high-power-density commercial/defense electronic devices such as high-performance microprocessors, laser diode arrays, high-power components in radar systems, switching components in power electronics, x-ray monochromator crystals, avionics power modules, and spacecraft power components.

Other objects, features, and advantages of the present invention will be explained in the following detailed description of the invention having reference to the appended drawings.

DETAILED DESCRIPTION OF INVENTION

In the following detailed description of the invention, certain preferred embodiments are illustrated providing certain specific details of their implementation. However, it will be recognized by one skilled in the art that many other variations and modifications may be made given the disclosed principles of the invention.

Figure 3:
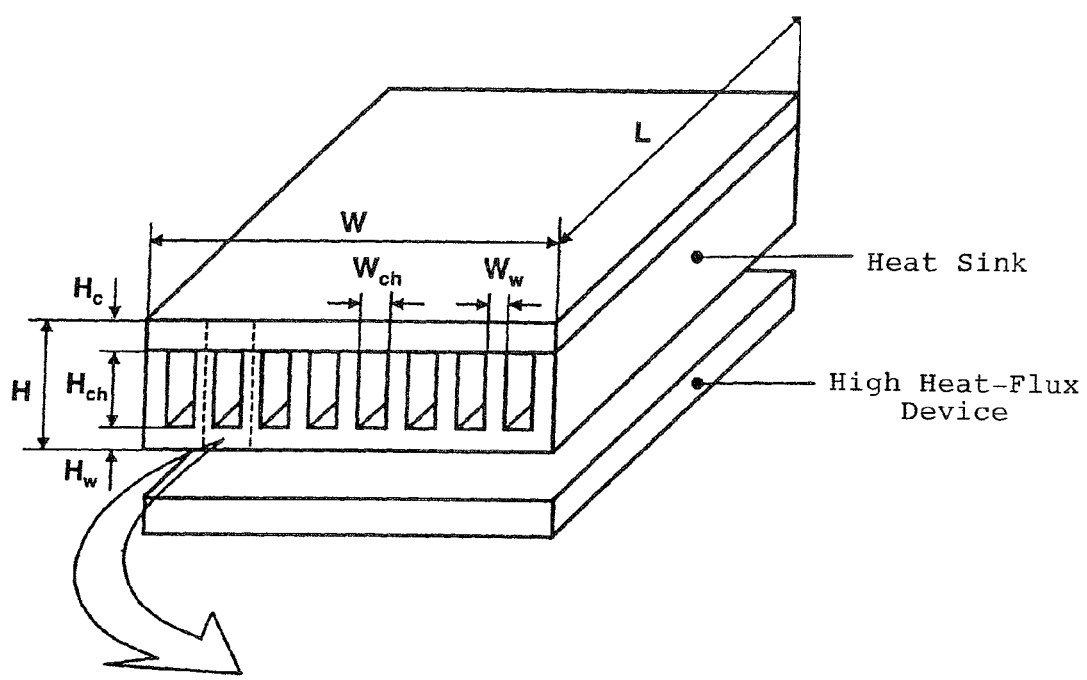
FIG. 3 shows a perspective view of a typical construction of a conventional micro-channel heat sink design.

Micro-channel heat sinks have emerged as a prime contender for thermal management of next generation high-power-density electronic devices, whose key technical merits include low thermal resistance, small coolant inventory requirement, small coolant flow rate requirement, and small heat sink mass and volume. A heat sink is classified as a micro-channel heat sink by the characteristic dimensions of the flow passages. FIG. 3 illustrates the typical construction of a conventional micro-channel heat sink design. The micro-channel heat sink has a length L and width W and is comprised of parallel channel walls on a planar base substrate defining flow channels in a longitudinal direction (of length L). The heat sink base substrate is typically fabricated from a high thermal conductivity solid material such as copper or silicon. The flow channels are formed as a series of parallel rectangular micro-slots machined into the substrate to form flow channels of a width $W_{ch}$ defined by channel walls with a width of $W_w$ and height $H_{ch}$. The micro-channels are closed using a cover plate on the top side to form a heat sink of overall width W, length L, and height H. Inlet and outlet plenums at inlet and outlet ends introduce and discharge liquid coolant into and from the flow passages. During operation, the heat sink is attached to the top surface of a high-heat-flux electronic device. Heat generated by the device is first transferred to the micro-channels through the solid substrate by heat conduction, and then carried away by the liquid coolant that is forced to flow through the micro-channels.

Micro-channel heat sinks can be classified as single-phase or two-phase. For a fixed dissipative heat flux and relatively high coolant flow rate, the coolant may maintain its liquid single-phase state throughout the micro-channels, which leads to a single-phase heat sink. When the coolant flow rate is relatively low, the liquid coolant may reach its boiling point while still flowing in the micro-channels and flow boiling occurs, which results in a two-phase heat sink. While single-phase heat sinks generally require less complicated flow delivery and control systems to operate, two-phase heat sinks offer additional advantages over their single-phase counterparts as a result of enhanced heat transfer associated with flow boiling, including much smaller coolant flow rate requirements, much higher convective heat transfer coefficients, and better stream-wise temperature uniformity.

Previous studies, such as the previously referenced "Thermal Design Methodology for Low Flow Rate Single-Phase and Two-Phase Micro-Channel Heat Sinks," IEEE Transactions on Components and Packaging Technologies, December 2007, have shown that two-phase micro-channel heat sinks can have advantages of low thermal resistance to heat dissipation, large surface-area-to-volume ratio, small heat sink weight and volume, small liquid coolant inventory and flow rate requirement, and relatively uniform temperature distribution along the stream-wise direction. However, one practical concern that hinders the implementation of this powerful cooling scheme is the temperature and pressure oscillation due to flow instability between flow channels through the common inlet and outlet plenums.

Figure 1:
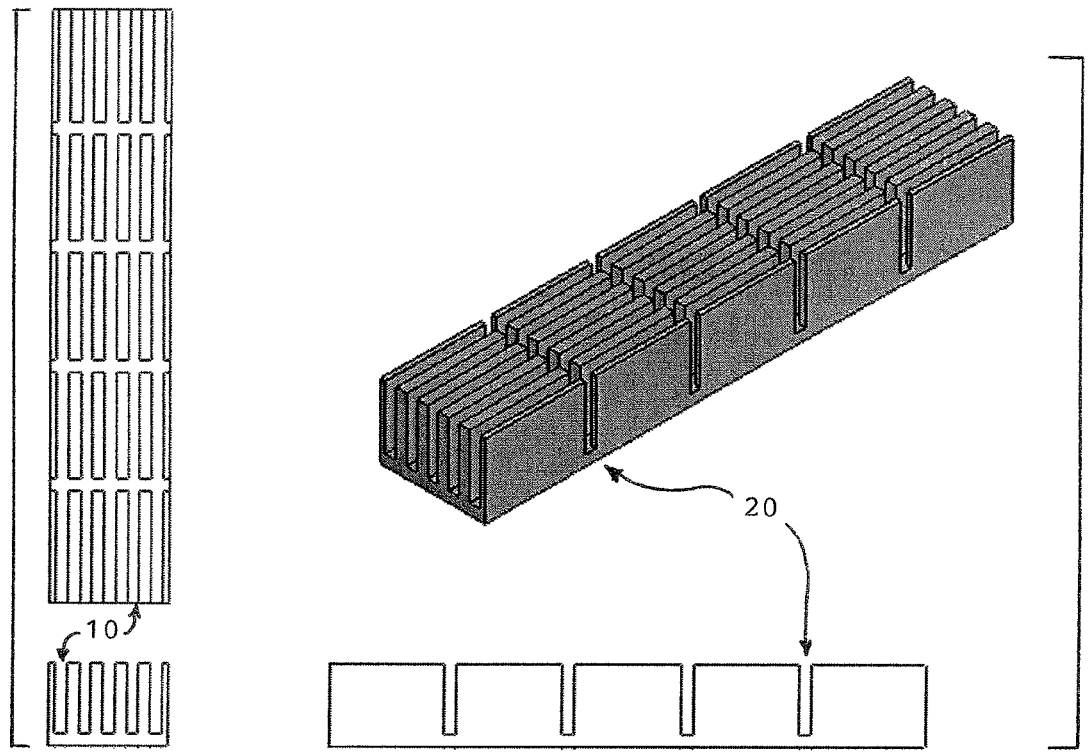
FIG. 1 illustrates a section of the cross-connected micro-channel heat sink design.
Figure 2:
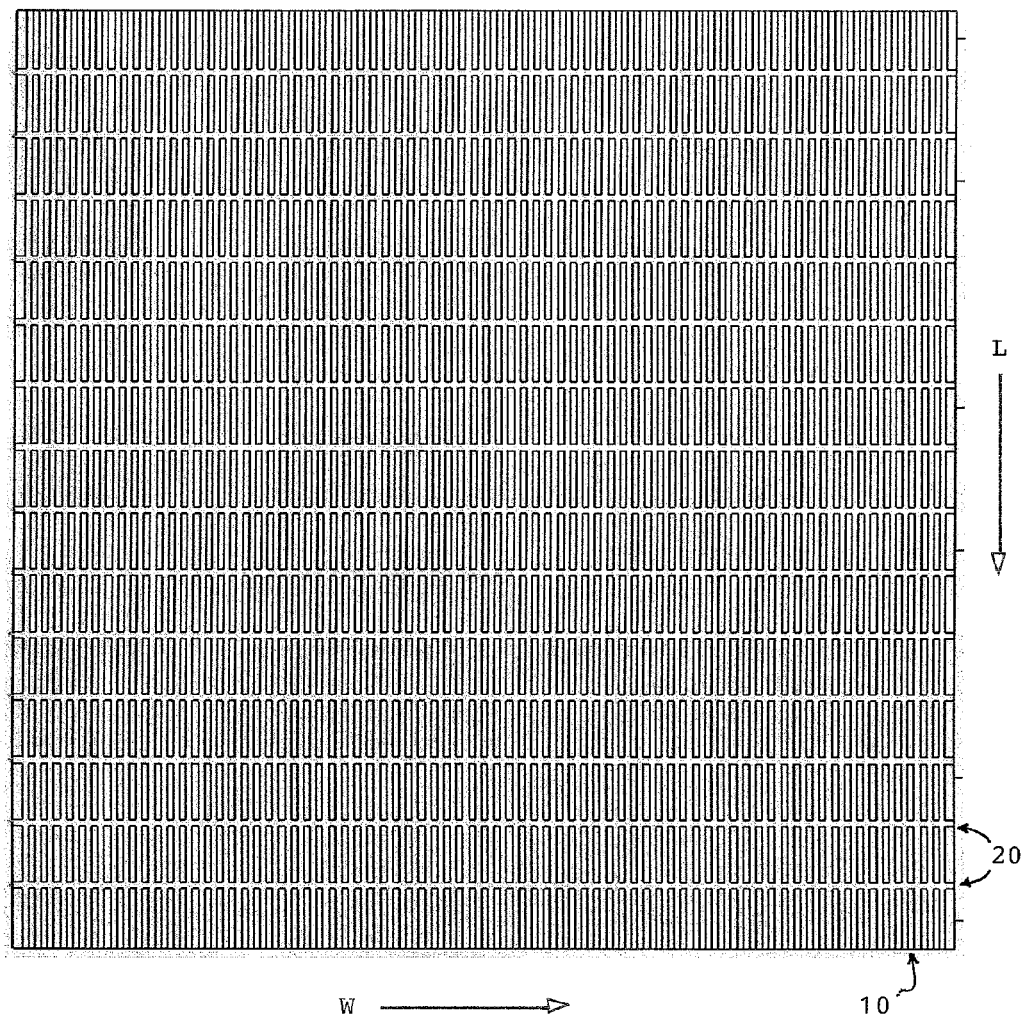
FIG. 2 shows a top view of an overall cross-connected micro-channel heat sink layout.

In accordance with the invention, an improved design for a two-phase micro-channel heat sink is shown in FIGS. 1 and 2. As in conventional micro-channel heat sinks, the heat sink layout has a plurality of flow micro-channels 10 extending in parallel in a longitudinal direction L and having channel walls substantially symmetrical with each other of a given wall thickness and defining a flow channel width and height for accommodating a flow of liquid coolant therein. The improved design provides a plurality of cross-connected micro-channels 20 extending in parallel in a transverse direction W normal to the longitudinal direction. The micro-channels 20 are substantially symmetrical with each other and formed at regular intervals along the longitudinal direction L for cross-connecting with the flow micro-channels, thereby enabling a uniform pressure field for two-phase flow boiling of liquid coolant in the heat sink.

In a preferred embodiment, the heat sink contains flow micro-channels with width of 100 μm, wall thickness of 100 μm, and height of 600 μm, and transverse micro-channel cross-connections of similar width and height cut at 1 mm intervals along the flow direction (at every 5 flow channels) to allow for communication between channels to reduce pressure oscillations.

The improved two-phase cross-connected micro-channel heat sink may be fabricated from silicon or high-thermal-conductivity metal such as copper. The flow micro-channels can have a width dimension ranging from 10 to 1000 micrometers. These micro-channels serve as passages for flow boiling of liquid coolant such as water and dielectric fluorochemical coolants. In application, a high-power-density electronic device is attached to the base surface of the heat sink. The heat generated by the device is first transferred to the micro-channels by heat conduction through the solid substrate, and then removed by the flow boiling of liquid coolant in the micro-channels.

The cross-connection of flow channels in the improved design provides uniform pressure distribution and prevents severe flow oscillation. It thus can provide marked technical advantages in low thermal resistance to heat dissipation, large surface-area-to-volume ratio, small heat sink weight and volume, small liquid coolant inventory and flow rate requirement, relatively uniform temperature distribution along the stream-wise direction, and stable flow. These attributes enable two-phase cross-connected micro-channel heat sinks to dissipate high heat fluxes from small areas, and hence, are suitable for thermal management of high-power-density electronic devices such as high-performance microprocessors, laser diode arrays, high-power components in radar systems, switching components in power electronics, x-ray monochromator crystals, avionics power modules, and spacecraft power components.

Figure 4:
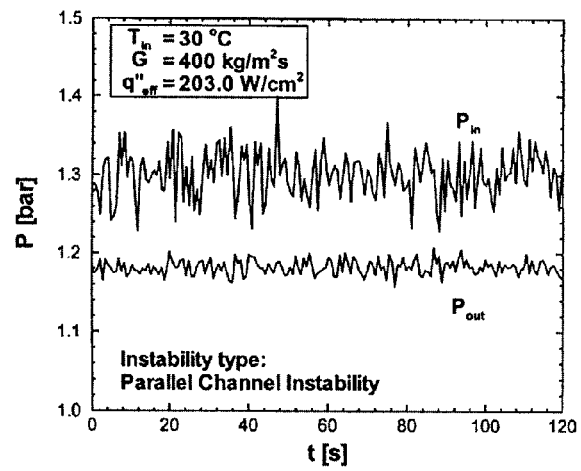
FIG. 4 is a graph showing a temporal record of inlet and outlet pressures for a conventional two-phase micro-channel design without cross connection.
Figure 5:
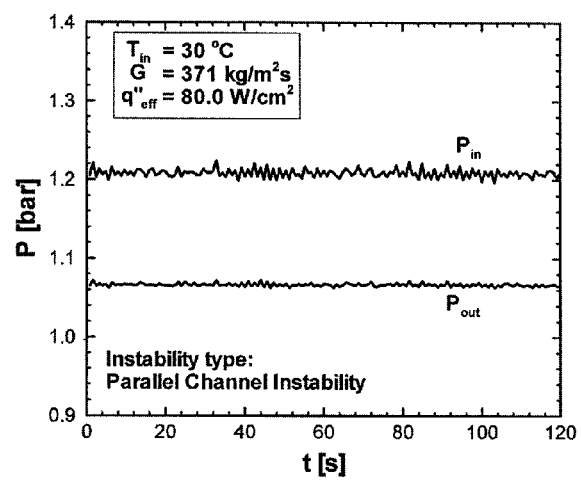
FIG. 5 is a graph showing a comparable temporal record of inlet and outlet pressures for the new cross-connected design.

The improved stability of flow boiling of liquid coolant in the cross-connected micro-channel design can be illustrated by comparing the amplitude of the instantaneous pressure fluctuation at the heat sink inlet and outlet. FIG. 4 shows a temporal record of inlet and outlet pressures for a conventional two-phase micro-channel design, having 231×713 micron micro-channels without cross connection and using water as coolant, and FIG. 5 shows a comparable temporal record for the new cross-connected design using dielectric fluorochemical FC-72 as coolant. The new cross-connected design showed markedly improved flow stability. It should be noted that while the operating conditions of inlet temperature and flow rate are comparable, the input heat flux for the conventional design in FIG. 4 is higher than that for the new design in FIG. 5, which is because water can transfer more heat than FC-72 during flow boiling process.

It is to be understood that many modifications and variations may be devised given the above description of the principles of the invention. It is intended that all such modifications and variations be considered as within the spirit and scope of this invention, as defined in the following claims.

The invention claimed is:

1. A two-phase micro-channel heat sink comprising:
   a first plurality of juxtaposed channel walls, each wall having a wall thickness, wherein the first plurality of channel walls defines a corresponding first plurality of flow micro-channels extending longitudinally between adjacent walls, wherein each micro-channel in the first plurality of micro-channels defines a flow channel width and a flow channel height configured to accommodate a flow of coolant therein;
   a second plurality of juxtaposed channel walls spaced from the first plurality of juxtaposed channel walls, wherein the second plurality of juxtaposed channel walls defines a corresponding second plurality of flow micro-channels extending longitudinally between adjacent walls; and
   a substrate defining a boiling region adapted to accommodate flow boiling of the coolant and being thermally coupled to the first plurality of juxtaposed channel walls and the second plurality of juxtaposed channel walls, wherein said flow boiling of the coolant generates a two-phase flow of coolant, wherein at least one gap between the first plurality of channel walls and the second plurality of channel walls defines at least one corresponding transverse micro-channel extending transverse to the flow micro-channels such that the first and second pluralities of flow micro-channels are cross-connected and thereby configured to facilitate pressure equalization in the two-phase flow of coolant among the flow micro-channels of the first plurality and the second plurality of flow micro-channels and inhibit unstable flow oscillations among the flow micro-channels, wherein the at least one gap comprises a plurality of gaps defining a corresponding plurality of transverse micro-channels and the flow micro-channels define a flow channel width of about 100 µm, a wall thickness of about 100 µm, and a flow channel height of about 600 µm, and the transverse micro-channels have a similar width and height and are spaced apart at about 1 mm intervals along the flow direction.

2. The two-phase micro-channel heat sink according to claim 1, wherein the transverse micro-channel defines a cross-channel width and a channel height similar to those of the flow micro-channel.

3. The two-phase micro-channel heat sink of claim 1, wherein the at least one gap comprises a plurality of gaps defining a corresponding plurality of transverse micro-channels, wherein the plurality of transverse micro-channels are spaced apart at substantially regular intervals measuring about five flow micro-channel widths.

4. The two-phase micro-channel heat sink of claim 1, wherein the second plurality of juxtaposed channel walls is positioned such that at least one of the channel walls in the second plurality of channel walls is substantially longitudinally aligned with and longitudinally spaced from a corresponding channel wall in the first plurality of juxtaposed channel walls so as to define one of the at least one gap.

* * * * *